(12) United States Patent
Scott et al.

(10) Patent No.: US 10,978,999 B2
(45) Date of Patent: Apr. 13, 2021

(54) DOHERTY RADIO FREQUENCY AMPLIFIER CIRCUITRY

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 12 days.

(21) Appl. No.: 16/436,252

(22) Filed: Jun. 10, 2019

(65) Prior Publication Data

US 2019/0379335 A1 Dec. 12, 2019

Related U.S. Application Data

(60) Provisional application No. 62/683,309, filed on Jun. 11, 2018.

(51) Int. Cl.
| | | |
|---|---|---|
| *H03F 1/07* | (2006.01) | |
| *H03F 1/02* | (2006.01) | |
| *H03F 3/19* | (2006.01) | |
| *H03G 3/30* | (2006.01) | |
| *H03F 1/56* | (2006.01) | |
| *H03F 1/32* | (2006.01) | |

(52) U.S. Cl.
CPC ............ *H03F 1/0288* (2013.01); *H03F 1/32* (2013.01); *H03F 1/56* (2013.01); *H03F 3/19* (2013.01); *H03G 3/3036* (2013.01); *H03F 2200/102* (2013.01); *H03F 2200/222* (2013.01); *H03F 2200/451* (2013.01); *H03G 2201/307* (2013.01)

(58) Field of Classification Search
CPC .................................. H03F 1/07; H03F 1/0288
USPC ............................................... 330/124 R, 295
See application file for complete search history.

(56) References Cited

U.S. PATENT DOCUMENTS

| | | | |
|---|---|---|---|
| 6,940,349 B2 | 9/2005 | Hellberg | |
| 10,148,228 B2* | 12/2018 | Hayes | ................... H03F 1/0266 |
| 10,355,647 B2* | 7/2019 | Datta | ...................... H03F 1/565 |
| 2018/0006611 A1 | 1/2018 | de Jong et al. | |
| 2018/0026593 A1* | 1/2018 | Ozard | ................... H03F 1/0288 |
| | | | 330/295 |
| 2020/0014337 A1 | 1/2020 | Scott et al. | |

OTHER PUBLICATIONS

Non-Final Office Action for U.S. Appl. No. 16/456,697, dated Dec. 30, 2020, 11 pages.

* cited by examiner

*Primary Examiner* — Henry Choe
(74) *Attorney, Agent, or Firm* — Withrow & Terranova, P.L.L.C.

(57) ABSTRACT

Doherty radio frequency (RF) amplifier circuitry includes an input node, an output node, a main amplifier path, and a peaking amplifier path. The main amplifier path is coupled between the input node and the output node and includes a main amplifier. The peaking amplifier path is coupled in parallel with the main amplifier path between the input node and the output node, and includes a peaking amplifier and a peaking variable gain preamplifier between the input node and the peaking amplifier. The peaking variable gain preamplifier is configured to adjust a current provided to the peaking amplifier.

21 Claims, 9 Drawing Sheets

DOHERTY RADIO FREQUENCY AMPLIFIER CIRCUITRY

RELATED APPLICATIONS

This application claims the benefit of provisional patent application Ser. No. 62/683,309, filed Jun. 11, 2018, the disclosure of which is hereby incorporated herein by reference in its entirety.

FIELD OF THE DISCLOSURE

The present disclosure relates to radio frequency (RF) amplifier circuitry, and in particular to Doherty RF amplifier circuitry with improved performance.

BACKGROUND

Radio frequency (RF) amplifier circuitry is used to increase the amplitude of RF signals for transmission. One popular type of RF amplifier circuitry is Doherty RF amplifier circuitry. Doherty RF amplifier circuitry includes a main amplifier path and a peaking amplifier path. Generally, at output power levels below an average power level, only the main amplifier path of the Doherty RF amplifier circuitry is active and thus amplifies RF input signals to provide RF output signals. The peaking amplifier path becomes active somewhere around the average power level, at which time the peaking amplifier path works in parallel with the main amplifier path to amplify the RF input signals and provide the RF output signals. When the peaking amplifier path becomes active, a significant amount of distortion is generated. Accordingly, linearization techniques such as digital predistortion must be used along with Doherty RF amplifier circuitry to achieve a desired linearity. At times, however, the distortion generated by Doherty RF amplifier circuitry may be too large for adequate compensation. Accordingly, there is a need for improved Doherty RF amplifier circuitry with reduced distortion.

SUMMARY

In one embodiment, Doherty radio frequency (RF) amplifier circuitry includes an input node, an output node, a main amplifier path, and a peaking amplifier path. The main amplifier path is coupled between the input node and the output node and includes a main amplifier. The peaking amplifier path is coupled in parallel with the main amplifier path between the input node and the output node, and includes a peaking amplifier and a peaking variable gain preamplifier between the input node and the peaking amplifier. The peaking variable gain preamplifier is configured to adjust a current provided to the peaking amplifier. The peaking variable gain preamplifier allows for adjustment of the current to the peaking amplifier, which in turn allows for adjustment of the output impedance of the peaking amplifier path presented to the main amplifier path. Accordingly, the peaking variable gain preamplifier can be used to reduce distortion in the Doherty RF amplifier circuitry when the peaking amplifier path is activated.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
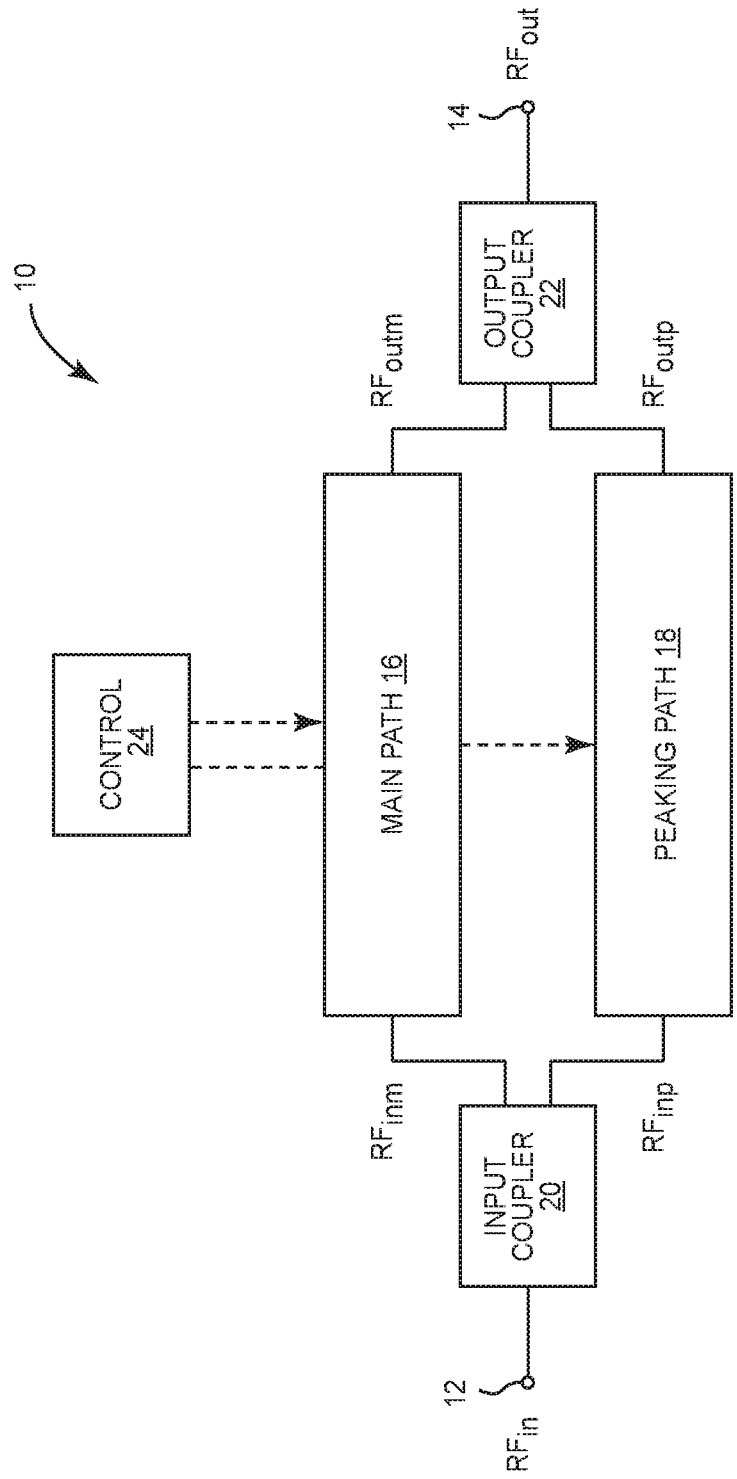
FIG. 1 illustrates Doherty radio frequency (RF) amplifier circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates Doherty radio frequency (RF) amplifier circuitry 10 according to one embodiment of the present disclosure. The Doherty RF amplifier circuitry 10 includes an input node 12, an output node 14, a main amplifier path 16 coupled between the input node 12 and the output node 14, a peaking amplifier path 18 coupled in parallel with the main amplifier path 16 between the input node 12 and the output node 14, an input coupler 20 coupled between the input node 12, the main amplifier path 16, and the peaking amplifier path 18, and an output coupler 22 coupled between the main amplifier path 16, the peaking amplifier path 18, and the output node 14. Control circuitry 24 may be coupled to devices in the main amplifier path 16 and the peaking amplifier path 18 to control the operation thereof.

In operation, RF input signals $RF_{in}$ are provided at the input node 12. The RF input signals $RF_{in}$ are provided to the input coupler 20, where they are divided into main RF input signals $RF_{inm}$, which are delivered to the main amplifier path 16, and peaking RF input signals $RF_{inp}$, which are delivered to the peaking amplifier path 18. When the output power level of the Doherty RF amplifier circuitry 10 is below a certain amount (e.g., an average power level), the control circuitry 24 causes the main amplifier path 16 to be active and the peaking amplifier path 18 to be inactive. The control circuitry 24 may do this, for example, by adjusting a bias signal provided to an amplifier in the main amplifier path 16 and the peaking amplifier path 18. When the main amplifier path 18 is active, it amplifies the main RF input signals $RF_{inm}$ to provide main RF output signals $RF_{outm}$. These main RF output signals $RF_{outm}$ are delivered to the output node 14 via the output coupler 22, where they are provided as RF output signals $RF_{out}$ at the output node 14.

When the output power of the Doherty RF amplifier circuitry is above a certain amount (e.g., an average power level), the control circuitry 24 causes the main amplifier path 16 and the peaking amplifier path 18 to be active. As discussed above, when the main amplifier path 16 is active, it amplifies the main RF input signals $RF_{inm}$ and provides main RF output signals $RF_{outm}$. When the peaking amplifier path 18 is active, it amplifies the peaking RF input signals $RF_{inp}$ to provide peaking RF output signals $RF_{outp}$. The main RF output signals $RF_{outm}$ are combined with the peaking RF output signals $RF_{outp}$ by the output power combining network 22, and the combined signals are provided as RF output signals $RF_{out}$ at the output node 14. Those skilled in the art will readily understand the basic operation of the Doherty RF amplifier circuitry 10, and thus the details thereof are not discussed herein.

The input coupler 20 may be any suitable coupling circuitry. In various embodiments, the input coupler 20 may be a quadrature coupler, a Lange coupler, a branchline coupler, or the like. Accordingly, the main RF input signals $RF_{inm}$ and the peaking RF input signals $RF_{inp}$ may comprise all or a portion of the RF input signals $RF_{in}$, phase-shifted versions of the RF input signals $RF_{in}$, or the like. In some embodiments, the control circuitry 24 may control one or more aspects of the operation of the input coupler 20. The input coupler 20 may also include input matching circuitry in some embodiments. Similarly, the output coupler 22 may be any suitable coupler circuitry. The output coupler 22 may combine the main RF output signals $RF_{outm}$ and the peaking RF output signals $RF_{outp}$ while phase shifting one or more of these signals to provide the RF output signals $RF_{out}$.

Figure 2:
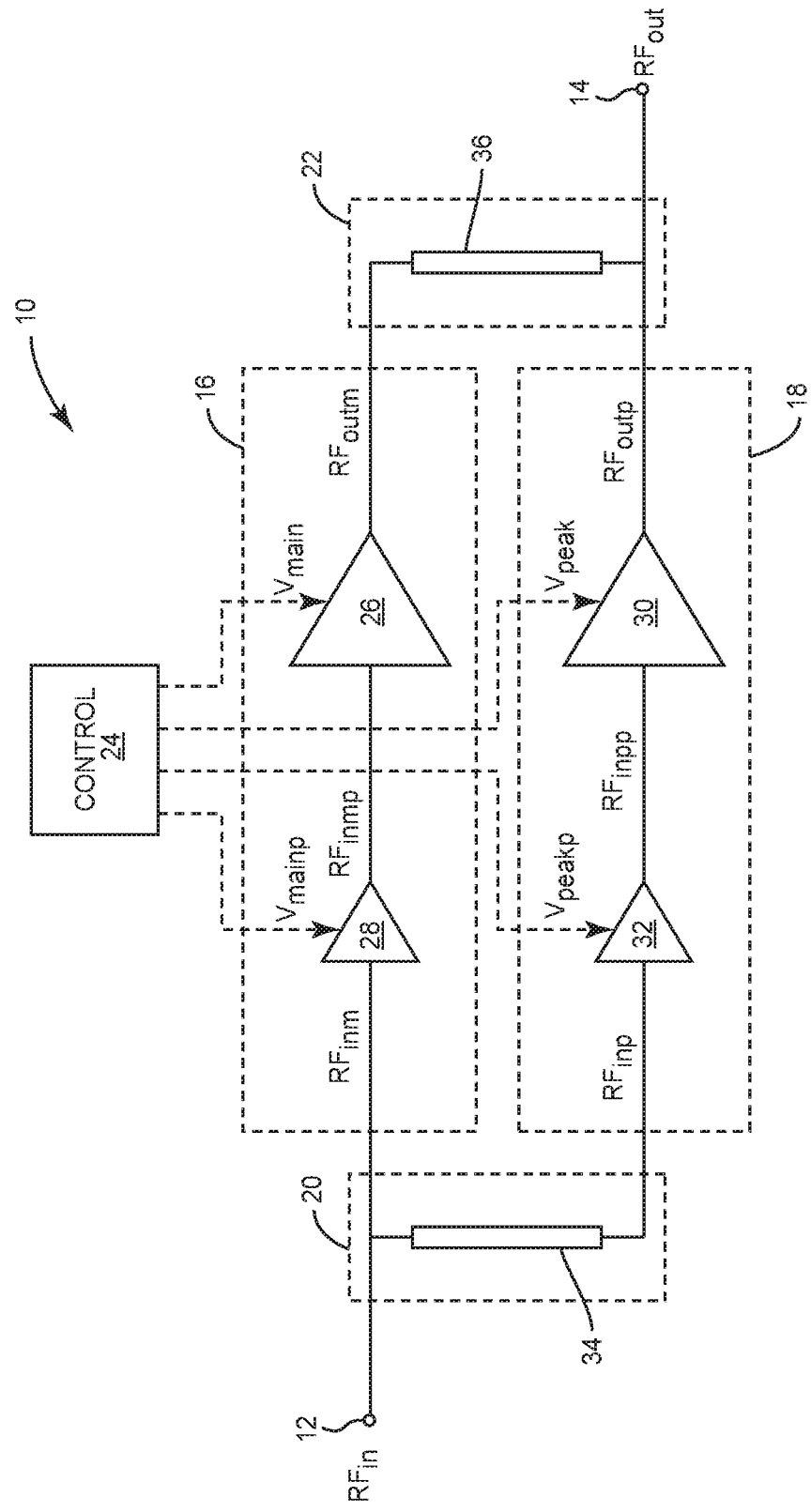
FIG. 2 illustrates Doherty RF amplifier circuitry according to one embodiment of the present disclosure.

FIG. 2 illustrates the Doherty RF amplifier circuitry 10 showing details of the main amplifier path 16 and the peaking amplifier path 18 according to one embodiment of the present disclosure. Further, FIG. 2 shows details of the input coupler 20 and the output coupler 22 according to one embodiment of the present disclosure. As shown in FIG. 2, the main amplifier path 16 includes a main amplifier 26 and a main variable gain preamplifier 28. The main variable gain preamplifier 28 is coupled between the input coupler 20 and the main amplifier 26. The main amplifier 26 is in turn coupled between the main variable gain preamplifier 28 and the output coupler 22. The peaking amplifier path 18 includes a peaking amplifier 30 and a peaking variable gain preamplifier 32. The peaking variable gain preamplifier 32 is coupled between the input coupler 20 and the peaking amplifier 30. The peaking amplifier 30 is in turn coupled between the peaking variable gain preamplifier 32 and the output coupler 22. The input coupler 20 directly couples the input node 12 to the main amplifier path 16 and includes an input coupler transmission line 34 coupled between the input node 12 and the peaking amplifier path 16. The output coupler 22 directly couples the peaking amplifier path 18 to the output node 14 and includes an output coupler transmission line 36 coupled between the main amplifier path 16 and the output node 14. The input coupler transmission line 34 and the output coupler transmission line 26 may provide a 90° phase shift.

In operation, RF input signals $RF_{in}$ provided at the input node 12 are separated by the input coupler 20 into main RF input signals $RF_{inm}$ and peaking RF input signals $RF_{inp}$. In the main amplifier path 16, the main variable gain preamplifier 28 amplifies the main RF input signals $RF_{inm}$ by an amount determined by a main preamplifier bias signal $V_{mainp}$ to provide pre-amplified main RF input signals $RF_{inmp}$. The main amplifier 26 then amplifies the pre-amplified main RF input signals $RF_{inmp}$ by an amount determined by a main amplifier bias signal $V_{main}$ to provide main RF output signals $RF_{outm}$. In the peaking amplifier path 18, the peaking variable gain preamplifier 32 amplifies the peaking RF input signals $RF_{inp}$ by an amount determined by a peaking preamplifier bias signal $V_{peakp}$ to provide pre-amplified peaking RF input signals $RF_{inpp}$. The peaking amplifier 30 then amplifies the pre-amplified peaking RF input signals $RF_{inpp}$ by an amount determined by a peaking amplifier bias signal $V_{peak}$ to provide peaking RF output signals $RF_{outp}$. The main RF output signals $RF_{outm}$ and the peaking RF output signals $RF_{outp}$ are then combined by the output coupler 22 to provide the RF output signals $RF_{out}$.

Figure 3:
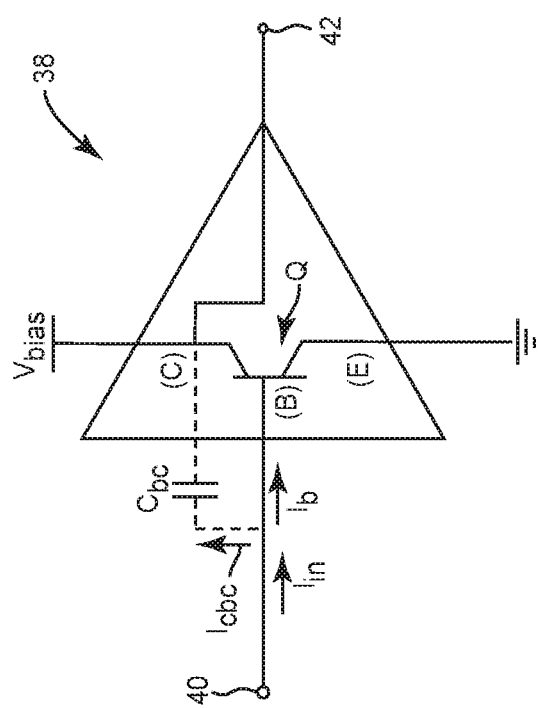
FIG. 3 illustrates amplifier circuitry according to one embodiment of the present disclosure.

As discussed above, one problem with Doherty RF amplifier circuitry 10 is that a significant amount of distortion is generated when the peaking amplifier path 24 becomes active. This is due to one or more parasitic impedances associated with the main amplifier 26 and the peaking amplifier 30. FIG. 3 illustrates an exemplary amplifier 38 according to one embodiment of the present disclosure. The amplifier 38 includes a transistor Q coupled between an input node 40 and an output node 42. Specifically, the transistor Q is a bipolar junction transistor (BJT) including a base (B) coupled to the input node 40, a collector (C) coupled to a bias voltage $V_{bias}$ and the output node 42, and an emitter (E) coupled to ground. For purposes of illustration, a parasitic base-collector capacitance $C_{bc}$ is also shown. Due to the base-collector capacitance $C_{bc}$, an input current $I_{in}$ provided to the amplifier 38 is split such that part of the input current $I_{in}$ flows into the base (B) of the transistor Q as a base current $I_b$ and part of the input current $I_{in}$ flows into the base-collector capacitance $C_{bc}$ as a base-collector capacitance current $I_{cbc}$. A graph shown in FIG. 4A shows a relationship between the input current $I_{in}$, the base current $I_b$, and the base-collector capacitance current $I_{cbc}$. This graph assumes a constant impedance at the output node 42. As shown, the input current $I_{in}$ is split between the base current $I_b$ and the base-collector capacitance current $I_{cbc}$.

As the amplifier 38 changes between active and inactive states (i.e., conducting and not-conducting), the output impedance thereof may change significantly. Accordingly, when the amplifier 38 is used in a Doherty configuration wherein it is coupled at the output node 42 to another amplifier, the impedance at the output node 42 may change significantly. FIG. 4B is a graph illustrating the relationship between the input current $I_{in}$, the base current $I_b$, and the base-collector capacitance current $I_{cbc}$ when the amplifier 38 is a main amplifier in a Doherty configuration (e.g., the main amplifier 26 in the Doherty RF amplifier circuitry 10 shown in FIG. 2). The graph illustrates the relationship between these currents when the peaking amplifier path 18 is inactive and when the peaking amplifier path 18 is active. When the peaking amplifier path 18 is inactive, the input current $I_{in}$ is split between the base current $I_b$ and the base-collector capacitance current $I_{cbc}$ as shown. This is because the peaking amplifier 30 is inactive and thus presents a relatively constant impedance at the output node 42 of the amplifier 38. When the peaking amplifier path 18 becomes active, the peaking amplifier 30 changes the impedance at the output node 42 of the amplifier 38 such that a voltage at the output node 42 stops growing. As a result, the base-collector capacitance current $I_{cbc}$ also stops growing as shown. To compensate for this fact, the input current $I_{in}$ should be adjusted as shown. This can be accomplished by the main variable gain preamplifier 28 as discussed below.

Figure 4C:
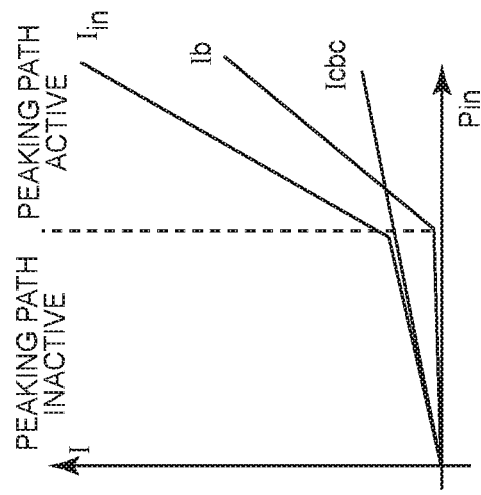
FIGS. 4A through 4C are graphs illustrating the operation of an amplifier according to various embodiments of the present disclosure.
Figure 4B:
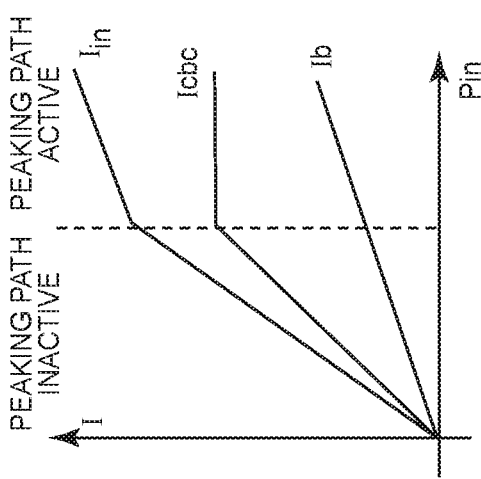
Figure 4A:
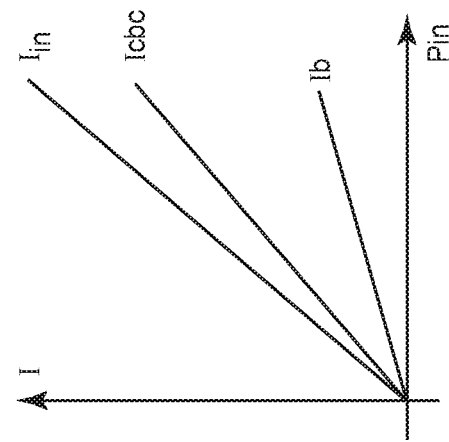

FIG. 4C is a graph illustrating the relationship between the input current $I_{in}$, the base current $I_b$, and the base-collector capacitance current $I_{cbc}$ when the amplifier 38 is a peaking amplifier in a Doherty configuration (e.g., the peaking amplifier 30 in the Doherty RF amplifier circuitry 10 shown in FIG. 2). The graph illustrates the relationship between these currents when the peaking amplifier path 18 is active and when the peaking amplifier path 18 is inactive. When the peaking amplifier path 18 is inactive, the input current $I_{in}$ is split between the base current $I_b$ and the base-collector capacitance current $I_{cbc}$ as shown. In particular, there is little to no base current $I_b$ because the peaking amplifier 30 is inactive, and thus the input current $I_{in}$ is nearly equal to the base-collector capacitance current $I_{cbc}$. When the peaking amplifier path 18 becomes active, the base current $I_b$ begins to grow. To compensate for this fact, the input current $I_{in}$ should be adjusted as shown. This can be accomplished by the peaking variable gain preamplifier 32 as discussed below.

If the input current $I_{in}$ is not adjusted to compensate for changes in the parasitic impedances of the amplifier 38 when the peaking amplifier path 18 is activated, the Doherty RF amplifier circuitry 10 will suffer from significant distortion. Accordingly, the control circuitry 24 is configured to adjust a gain of the main variable gain preamplifier 28 and the peaking variable gain preamplifier 32 to cancel feedback caused by the parasitic impedance of the main amplifier 26 and the peaking amplifier 30 and thus improve the performance of the Doherty RF amplifier circuitry 10. The control circuitry 24 may adjust the gain of the main variable gain preamplifier 28 by providing the main preamplifier bias signal $V_{mainp}$ thereto and may adjust the gain of the peaking variable gain preamplifier 32 by providing the peaking preamplifier bias signal $V_{peakp}$ thereto. However, the present disclosure is not so limited. The control circuitry 24 may adjust the gain of the main variable gain preamplifier 28 and the peaking variable gain preamplifier 32 in any suitable manner. The control circuitry 24 may also adjust a bias of the main amplifier 26 and the peaking amplifier 30 by providing the main amplifier bias signal $V_{main}$ and the peaking amplifier bias signal $V_{peak}$, respectively, thereto. Accordingly, the control circuitry 24 may control the operation of the main amplifier 26 and the peaking amplifier 30, and may activate and deactivate the main amplifier path 16 and the peaking amplifier path 18.

Figure 5:
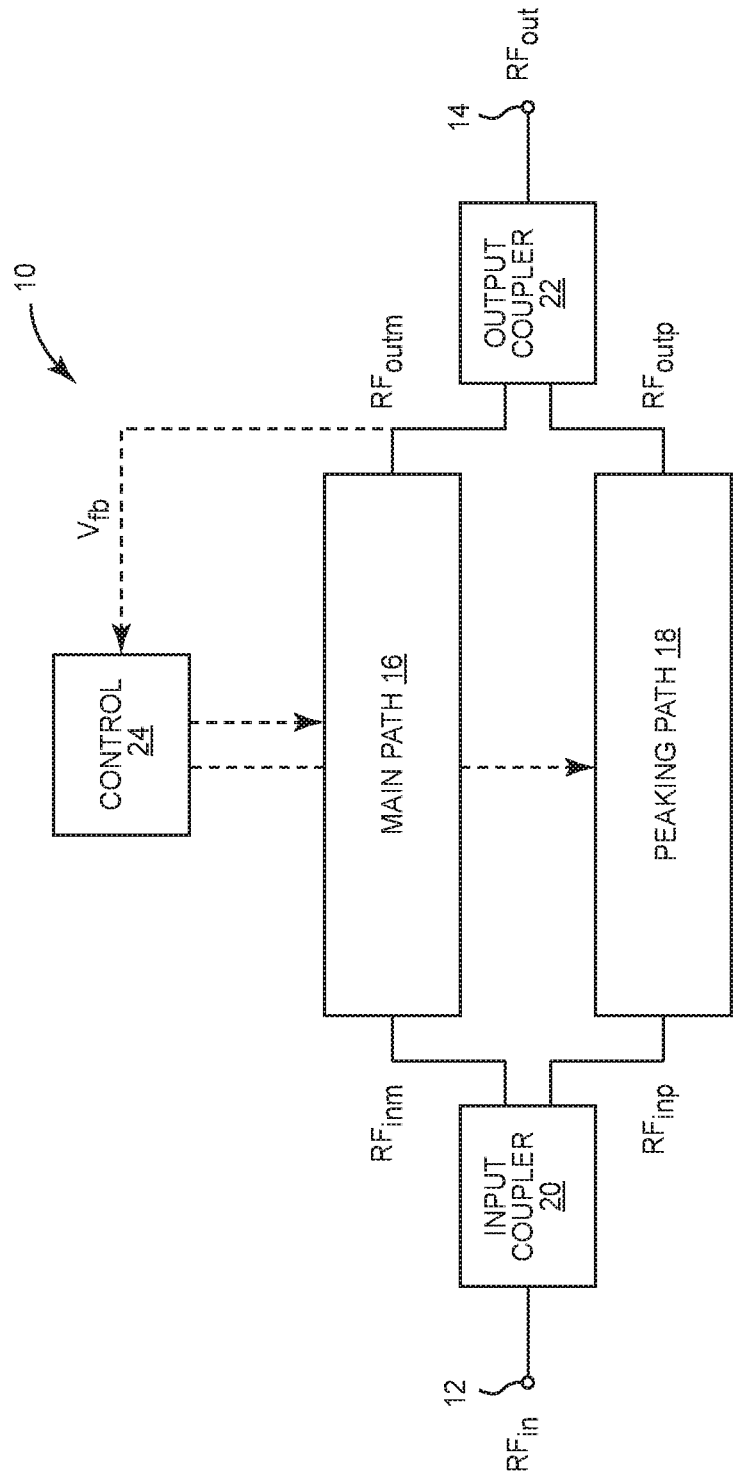
FIG. 5 illustrates Doherty RF amplifier circuitry according to one embodiment of the present disclosure.

FIG. 5 shows the Doherty RF amplifier circuitry 10 according to an additional embodiment of the present disclosure. The Doherty RF amplifier circuitry 10 shown in FIG. 5 is substantially similar to that shown in FIG. 1, except that the control circuitry 24 is coupled to the main amplifier path 16 to receive a feedback signal $V_{fb}$. Accordingly, a feedback loop is formed between the main amplifier path 16 and the control circuitry 24. The feedback signal $V_{fb}$ may be used by the control circuitry 24 to adjust the gain of the main variable gain preamplifier 28 and the peaking variable gain preamplifier 32. Further, the feedback signal $V_{fb}$ may be used by the control circuitry 24 to adjust a bias of the main amplifier 26 and the peaking amplifier 30. The feedback signal $V_{fb}$ may be a voltage at the output of the main amplifier 26. In some embodiments, the feedback signal $V_{fb}$ may be used to detect a saturation condition of the main amplifier 26 (e.g., when the main amplifier 26 is entering saturation). Accordingly, the control circuitry 24 may include a saturation detector, or a saturation detector may be provided external to the control circuitry 24 in the feedback loop (not shown).

Figure 6:
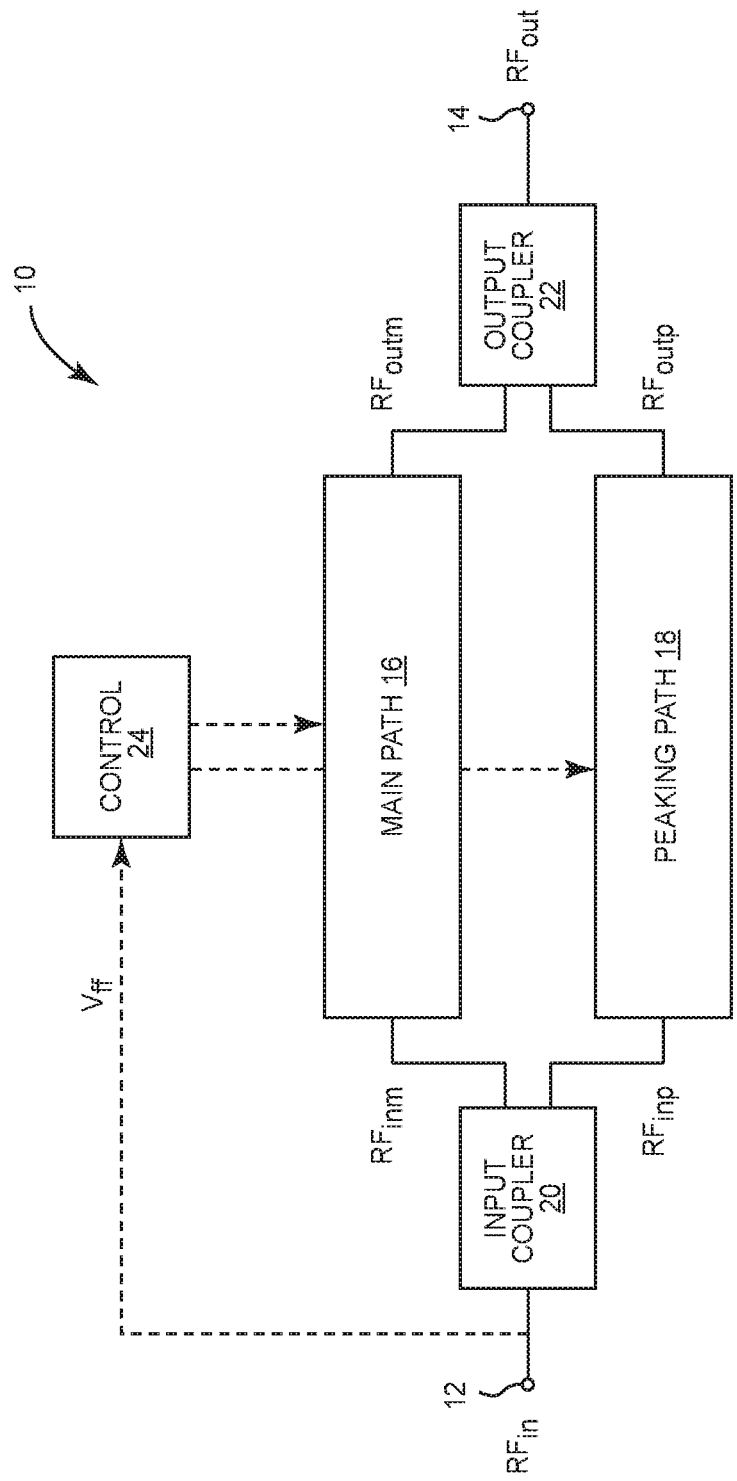
FIG. 6 illustrates Doherty RF amplifier circuitry according to one embodiment of the present disclosure.

FIG. 6 shows the Doherty RF amplifier circuitry 10 according to an additional embodiment of the present disclosure. The Doherty RF amplifier circuitry 10 shown in FIG. 6 is substantially similar to that shown in FIG. 1, except that the control circuitry 24 is coupled to the main amplifier path 16 to receive a feedforward signal $V_{ff}$. Accordingly, a feedforward loop is formed between the main amplifier path 16 and the control circuitry 24. The feedforward signal $V_{ff}$ may be used by the control circuitry 24 to adjust the gain of the main variable gain preamplifier 28 and the peaking variable gain preamplifier 32. Further, the feedforward signal $V_{ff}$ may be used by the control circuitry 24 to adjust a bias of the main amplifier 26 and the peaking amplifier 30. The feedforward signal $V_{ff}$ may be an envelope signal representing an envelope of the RF input signals $RF_{in}$. To obtain this envelope signal, the control circuitry 24 may include an envelope detector, or an envelope detector may be provided external to the control circuitry 24 in the feedforward loop (not shown). The envelope signal may be a digital or analog signal, and further may be post-processed by the control circuitry 24 in any suitable manner before being used to operate the Doherty RF amplifier circuitry 10 as discussed herein. Additional circuitry such as amplification circuitry may also be included in the feedforward loop, for example, to compensate for the case when an amplitude of the RF input signals $RF_{in}$ is too low for proper envelope detection. In some embodiments, the feedforward signal $V_{ff}$ may be obtained from a different point in the peaking amplification path 18, for example, after the peaking variable gain preamplifier 32, so that the RF input signals obtained are of sufficient amplitude for envelope detection.

Figure 7:
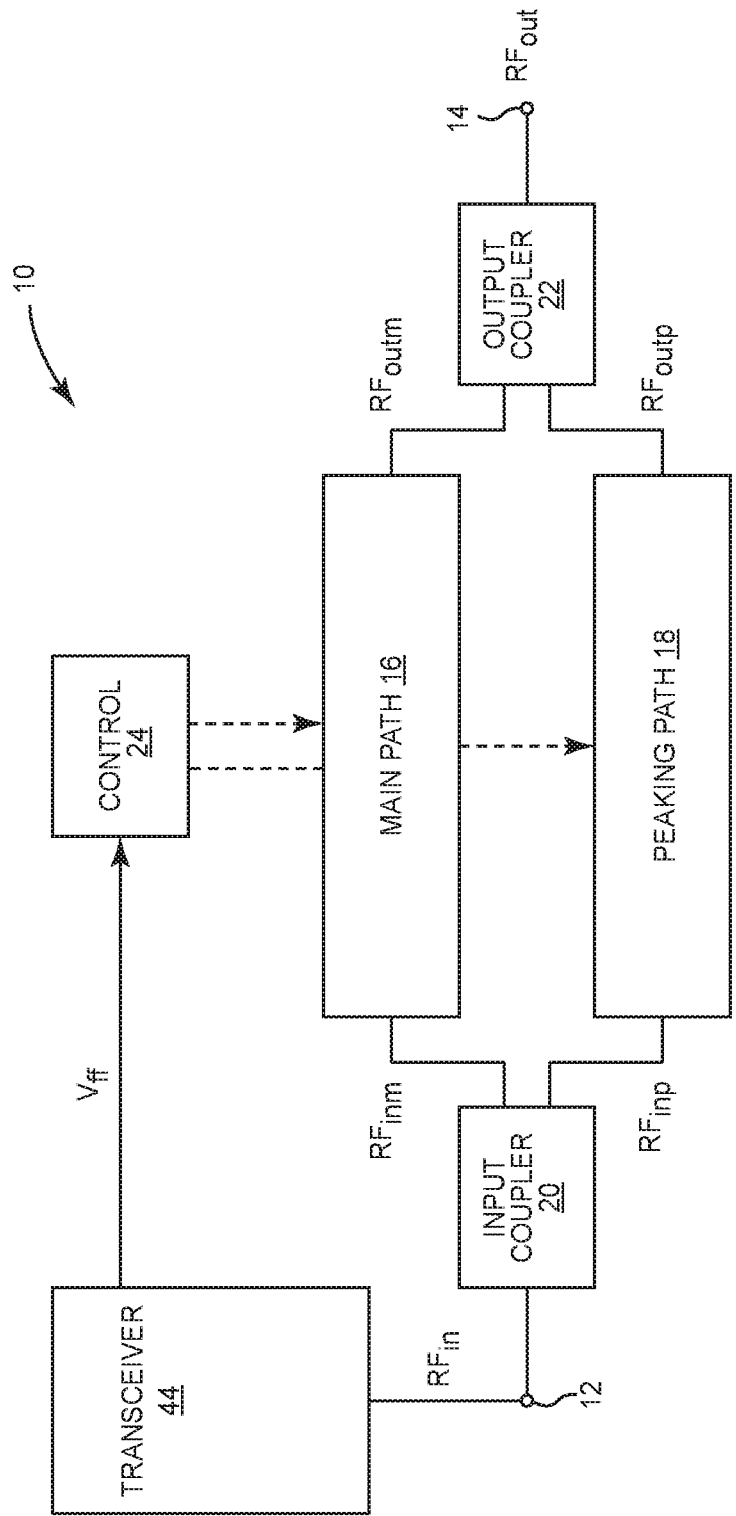
FIG. 7 illustrates Doherty RF amplifier circuitry according to one embodiment of the present disclosure.

FIG. 7 shows the Doherty RF amplifier circuitry 10 according to an additional embodiment of the present disclosure. The Doherty RF amplifier circuitry 10 shown in FIG. 7 is substantially similar to that shown in FIG. 1, except that transceiver circuitry 44 is also shown for context. The transceiver circuitry 44 provides the RF input signals $RF_{in}$ to the input node 12. Further, the transceiver circuitry 44 may provide an envelope signal as a feedforward signal $V_{ff}$ to the control circuitry 24 such that a feedforward loop is formed between the transceiver circuitry 44 and the control circuitry 24. As discussed above, the control circuitry 24 may use the feedforward signal $V_{ff}$ to adjust the gain of the main variable gain preamplifier 28 and the peaking variable gain preamplifier 32. Further, the control circuitry 24 may use the feedforward signal $V_{ff}$ to adjust a bias of the main amplifier 26 and the peaking amplifier 30. The envelope signal provided by the transceiver circuitry 44 may be a digital or analog signal, and further may be post-processed by the control circuitry 24 in any suitable manner before being used to operate the Doherty RF amplifier circuitry 10 as discussed herein. The transceiver circuitry 44 may be baseband circuitry in some embodiments.

Figure 8:
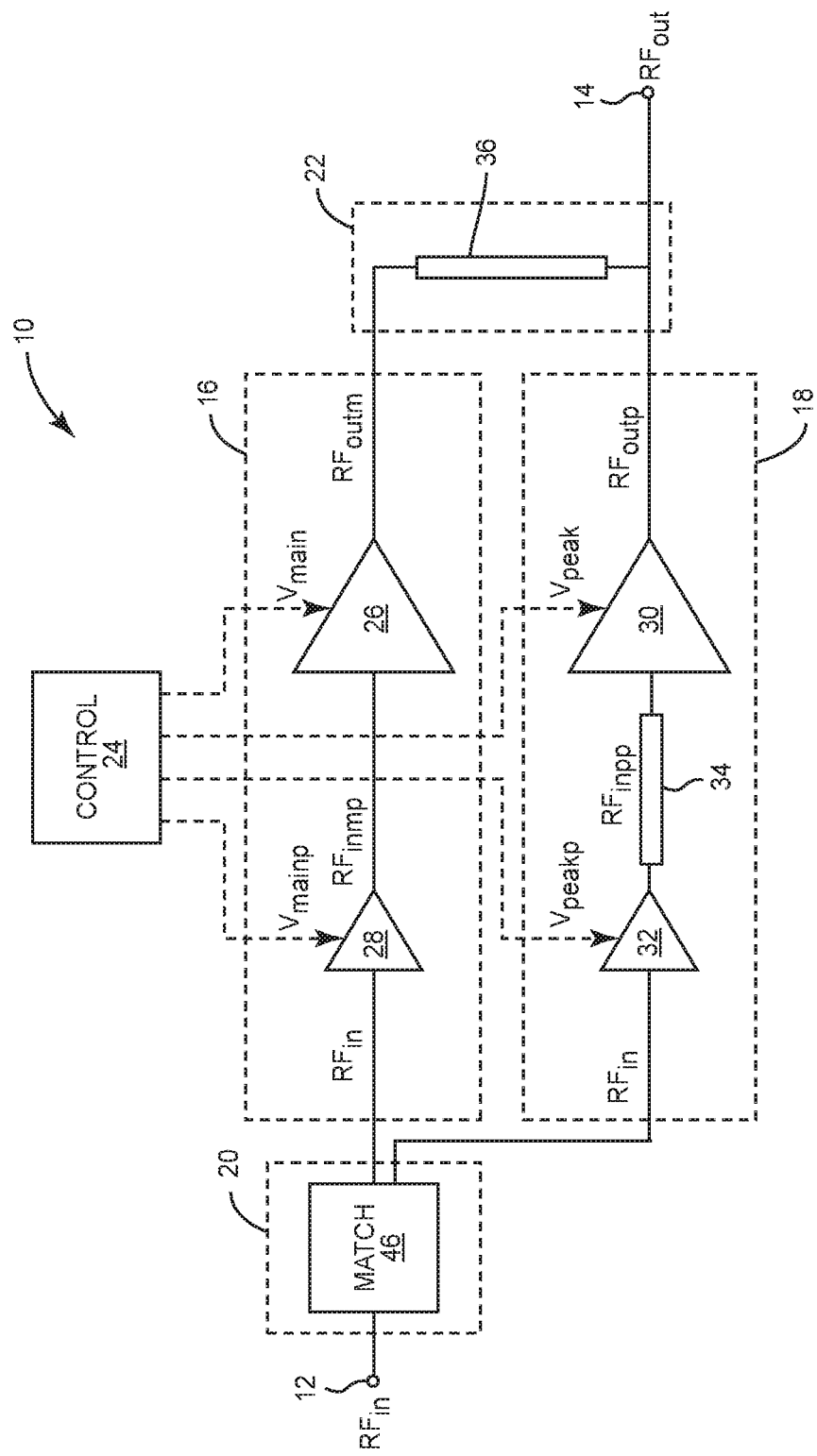
FIG. 8 illustrates Doherty RF amplifier circuitry according to one embodiment of the present disclosure.

FIG. 8 shows the Doherty RF amplifier circuitry 10 according to an additional embodiment of the present disclosure. The Doherty RF amplifier circuitry 10 shown in FIG. 8 is substantially similar to that shown in FIG. 2, except that the input coupler 20 includes input matching circuitry 46 configured to match an impedance presented at the input node 12 and the input coupler transmission line 34 is moved from the input coupler 20 into the peaking amplifier path 18 between the peaking variable gain preamplifier 32 and the peaking amplifier 30. In such an embodiment, both of the main variable gain preamplifier 28 and the peaking variable gain preamplifier 32 share a single input matching network (the input matching circuitry 46). The Doherty RF amplifier circuitry 10 functions in a similar manner to that discussed above.

Figure 9:
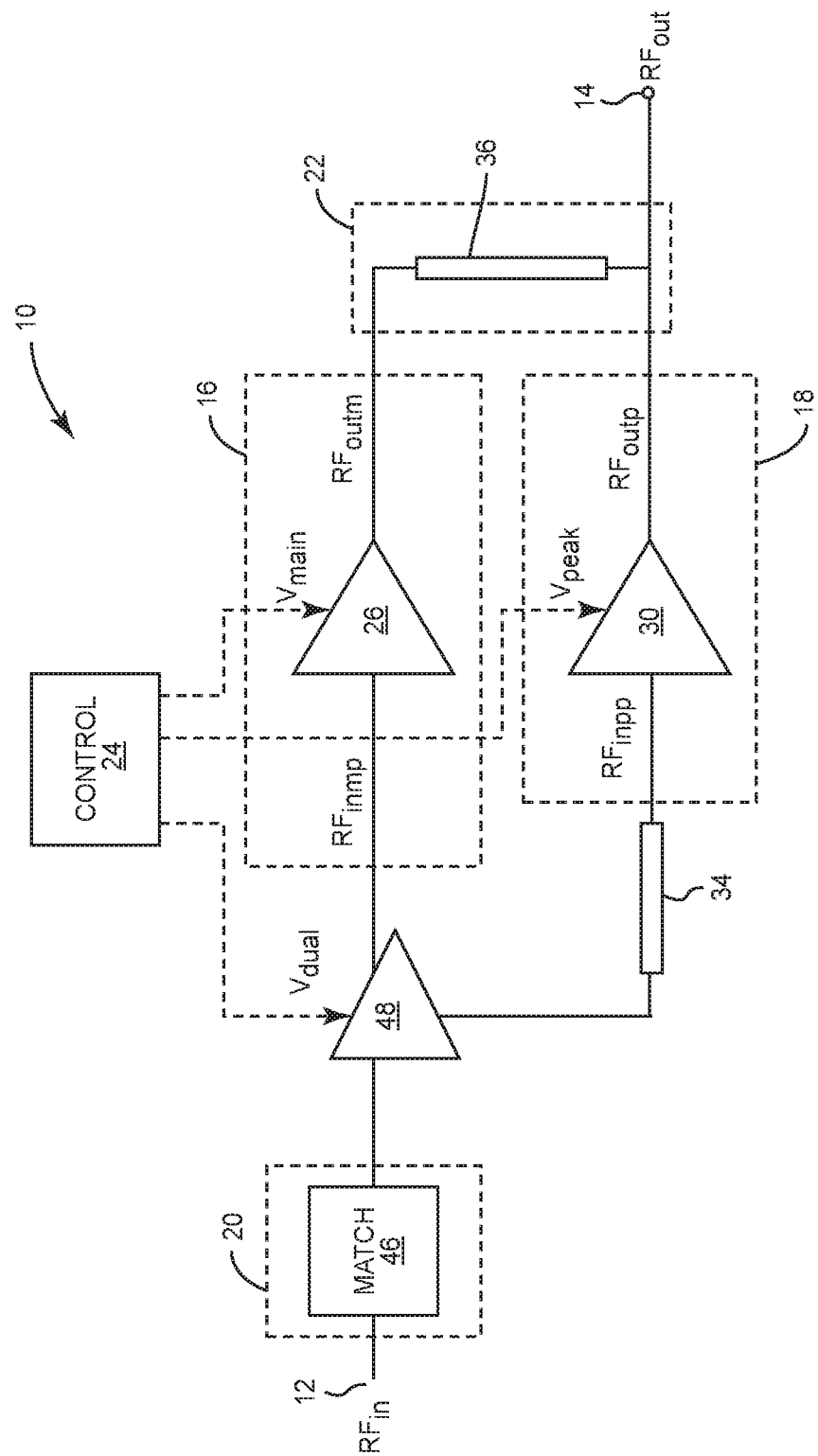
FIG. 9 illustrates Doherty RF amplifier circuitry according to one embodiment of the present disclosure.

FIG. 9 shows the Doherty RF amplifier circuitry 10 according to an additional embodiment of the present disclosure. The Doherty RF amplifier circuitry 10 shown in FIG. 9 is substantially similar to that shown in FIG. 8, except that the main variable gain preamplifier 28 and the peaking variable gain preamplifier 32 are replaced by a dual current steering preamplifier 48. Notably, as discussed above, the current required by the main amplifier 26 and the current required by the peaking amplifier 30 to avoid distortion are opposite. That is, when the peaking amplifier path 18 is activated, the main amplifier 26 requires less current and the peaking amplifier 30 requires more current. Accordingly, in the embodiments discussed above the control circuitry 24 is configured to adjust the gain of the main variable gain preamplifier 28 down when the peaking amplifier path 18 is activated and adjust the gain of the peaking variable gain preamplifier 32 up when the peaking amplifier path 18 is activated. In other words, the control circuitry 24 is configured to adjust the gain of the main variable gain preamplifier 28 and the peaking variable gain preamplifier 32 in a complementary manner. With this in mind, it may be more efficient in some circumstances to combine the functionality of the main variable gain preamplifier 28 and the peaking variable gain preamplifier 32 into the dual current steering amplifier 48. Due to the fact that the current requirements of the main amplifier path 16 and the current amplifier path 18 will be complementary, a single amplifier device which steers more current towards the main amplifier path 16 or the peaking amplifier path 18 can be provided. A single input matching circuitry 46 may be used for the dual current steering preamplifier 48. The input coupler transmission line 34 may be located between the dual current steering preamplifier 48 and the peaking amplifier 30. The dual current steering preamplifier 48 may function similarly to the main variable gain preamplifier 28 and the peaking variable gain preamplifier 32. That is, the dual current steering preamplifier 48 may receive the RF input signals $RF_{in}$ and amplify the RF input signals by an amount determined by a dual current steering bias signal $V_{dual}$ to provide pre-amplified main RF input signals $RF_{inmp}$ to the main amplifier path 16 and pre-amplified peaking RF input signals $RF_{inpp}$ to the peaking amplifier path 18. The remainder of the Doherty RF amplifier circuitry 10 may operate as described above.

At a high level, the present disclosure contemplates using variable gain amplifiers in the main amplifier path and the peaking amplifier path of Doherty RF amplifier circuitry to control a current provided to a main amplifier and a peaking amplifier in order to compensate for changes in parasitic impedances associated with the main amplifier and the peaking amplifier and thus reduce distortion that normally occurs during activation and deactivation of a peaking amplifier path. The above examples illustrate that the control circuitry may use any number of input signals (e.g., feedback, feedforward, envelope signals, digital signals, analog signals, etc.) in order to adjust a gain of the variable gain amplifiers and activate and deactivate the peaking amplifier path. Notably, the above examples are not exhaustive and the present disclosure contemplates the use of the above concepts in any suitable manner.

Those skilled in the art will recognize improvements and modifications to the preferred embodiments of the present disclosure. All such improvements and modifications are considered within the scope of the concepts disclosed herein and the claims that follow.

What is claimed is:
1. Doherty radio frequency (RF) amplifier circuitry comprising:
    an input node and an output node;
    a main amplifier path coupled between the input node and the output node, the main amplifier path comprising a main amplifier;

a peaking amplifier path coupled between the input node and the output node, the peaking amplifier path comprising:
   a peaking amplifier; and
   a peaking variable gain preamplifier between the input node and the peaking amplifier, the peaking variable gain preamplifier configured to adjust a current provided to the peaking amplifier; and
control circuitry configured to adjust a gain of the peaking variable gain preamplifier to compensate for parasitic impedance of the main amplifier and the peaking amplifier.

2. The Doherty RF amplifier circuitry of claim 1 further comprising an input coupler between the input node, the main amplifier path, and the peaking amplifier path, the input coupler configured to receive an RF input signal, provide a first portion of the RF input signal to the main amplifier path, and provide a second portion of the RF input signal to the peaking amplifier path.

3. The Doherty RF amplifier circuitry of claim 2 further comprising an output coupler coupled between the main amplifier path, the peaking amplifier path, and the output node, the output coupler configured to combine a main output signal from the main amplifier path and a peaking output signal from the peaking amplifier path to provide an RF output signal.

4. The Doherty RF amplifier circuitry of claim 1 wherein the control circuitry is further configured to:
   adjust a main bias signal provided to the main amplifier; and
   adjust a peaking bias signal provided to the peaking amplifier.

5. The Doherty RF amplifier circuitry of claim 1 wherein the control circuitry is further configured to:
   detect a saturation condition of the main amplifier; and
   adjust the gain of the peaking variable gain preamplifier based on the detection of the saturation condition.

6. The Doherty RF amplifier circuitry of claim 1 wherein:
   the control circuitry comprises a feedback loop; and
   the control circuitry is configured to adjust the gain of the peaking variable gain preamplifier based on the feedback loop.

7. The Doherty RF amplifier circuitry of claim 1 wherein:
   the control circuitry comprises a feedforward loop; and
   the control circuitry is configured to adjust the gain of the peaking variable gain preamplifier based on the feedforward loop.

8. The Doherty RF amplifier circuitry of claim 1 wherein the control circuitry is configured to adjust the gain of the peaking variable gain preamplifier based on an envelope signal provided by an envelope signal detector.

9. The Doherty RF amplifier circuitry of claim 8 wherein the envelope signal detector is part of the control circuitry.

10. The Doherty RF amplifier circuitry of claim 9 wherein:
   the control circuitry further comprises envelope signal post-processing circuitry configured to process the envelope signal to provide a processed envelope signal; and
   the control circuitry is configured to adjust the gain of the peaking variable gain preamplifier based on the processed envelope signal.

11. The Doherty RF amplifier circuitry of claim 8 wherein the envelope signal is a digital signal.

12. The Doherty RF amplifier circuitry of claim 8 wherein the envelope signal is an analog signal.

13. The Doherty RF amplifier circuitry of claim 1 wherein the control circuitry is configured to adjust the gain of the peaking variable gain preamplifier based on an envelope signal provided by one of transceiver circuitry and baseband circuitry.

14. The Doherty RF amplifier circuitry of claim 13 wherein the envelope signal is a digital signal.

15. The Doherty RF amplifier circuitry of claim 13 wherein the envelope signal is an analog signal.

16. The Doherty RF amplifier circuitry of claim 1 further comprising a main variable gain preamplifier configured to adjust a current provided to the main amplifier.

17. The Doherty RF amplifier circuitry of claim 16 wherein the control circuitry is further configured to adjust a gain of the main variable gain preamplifier.

18. The Doherty RF amplifier circuitry of claim 17 wherein the control circuitry is further configured to:
   adjust a main bias signal provided to the main amplifier; and
   adjust a peaking bias signal provided to the peaking amplifier.

19. The Doherty RF amplifier circuitry of claim 16 wherein the control circuitry is further configured to:
   detect a saturation condition of the main amplifier; and
   adjust a gain of the main variable gain amplifier and adjust the gain of the peaking variable gain amplifier based on the detection of the saturation condition.

20. Doherty radio frequency (RF) amplifier circuitry comprising:
   an input node and an output node;
   a main amplifier path coupled between the input node and the output node, the main amplifier path comprising a main amplifier;
   a peaking amplifier path coupled between the input node and the output node, the peaking amplifier path comprising:
      a peaking amplifier; and
      a peaking variable gain preamplifier between the input node and the peaking amplifier, the peaking variable gain preamplifier configured to adjust a current provided to the peaking amplifier; and
   control circuitry configured to:
      detect a saturation condition of the main amplifier; and
      adjust a gain of the peaking variable gain preamplifier based on the detection of the saturation condition.

21. Doherty radio frequency (RF) amplifier circuitry comprising:
   an input node and an output node;
   a main amplifier path coupled between the input node and the output node, the main amplifier path comprising a main amplifier;
   a peaking amplifier path coupled between the input node and the output node, the peaking amplifier path comprising:
      a peaking amplifier; and
      a peaking variable gain preamplifier between the input node and the peaking amplifier, the peaking variable gain preamplifier configured to adjust a current provided to the peaking amplifier; and
   control circuitry comprising one of a feedback loop or a feedforward loop, wherein the control circuitry is configured to adjust a gain of the peaking variable gain preamplifier based on the one of the feedback loop or the feedforward loop.

* * * * *